(12) United States Patent
Byun (10) Patent No.: US 11,656,996 B2
(45) Date of Patent: May 23, 2023

(54) CONTROLLER FOR MANAGING ORDER INFORMATION OF DATA, OPERATION METHOD THEREOF, AND MEMORY SYSTEM INCLUDING THE SAME

(71) Applicant: SK hynix Inc., Gyeonggi-do (KR)

(72) Inventor: Eu Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/186,542

(22) Filed: Feb. 26, 2021

(65) Prior Publication Data

US 2022/0100671 A1 Mar. 31, 2022

(30) Foreign Application Priority Data

Sep. 28, 2020 (KR) .................. 10-2020-0125764

(51) Int. Cl.
*G06F 12/0882* (2016.01)
*G06F 12/02* (2006.01)
*G06F 3/06* (2006.01)

(52) U.S. Cl.
CPC ........ *G06F 12/0882* (2013.01); *G06F 3/0604* (2013.01); *G06F 3/0647* (2013.01); *G06F 3/0679* (2013.01); *G06F 12/0238* (2013.01)

(58) Field of Classification Search
CPC ................. G06F 3/0604; G06F 3/0679; G06F 2212/7205; G06F 2212/7207; G06F 2212/7211
See application file for complete search history.

(56) References Cited

U.S. PATENT DOCUMENTS

2018/0336127 A1* 11/2018 Hutchison ........... G06F 12/0246
2021/0182207 A1*  6/2021 D'Eliseo ............. G06F 12/1009

FOREIGN PATENT DOCUMENTS

KR         10-1804034          12/2017

* cited by examiner

*Primary Examiner* — Tracy A Warren
(74) *Attorney, Agent, or Firm* — IP & T Group LLP (57) ABSTRACT

A memory system includes a memory device comprising a plurality of pages, and a controller suitable for storing data, inputted in response to a write command received from a host, in corresponding pages among the plurality of pages, wherein the controller generates and manages a bitmap table indicating order information of the inputted data according to the type of the write command.

14 Claims, 6 Drawing Sheets

| | | | | |
|---|---|---|---|---|
| P0 | 1 | 1 | 1 | 1 |
| P4 | 1 | 1 | 1 | 1 |
| , | 1 | 1 | 1 | 1 |
| , | 1 | 1 | 1 | 1 |
| , | 1 | 1 | 1 | 1 |
| , | 1 | 1 | 1 | 1 |
| , | 1 | 1 | 1 | 1 |
| , | 1 | 1 | 1 | 1 |

270a

P30  P31

First-Type Write Command (WTa)

FIG. 3B

|  | | | | |
|---|---|---|---|---|
| P0 | 0 | 1 | 1 | 1 |
| P4 | 1 | 1 | 1 | 1 |
| · | 1 | 1 | 1 | 1 |
| · | 1 | 1 | 1 | 1 |
| , | 1 | 1 | 1 | 1 |
| · | 1 | 1 | 1 | 1 |
| · | 1 | 1 | 1 | 1 |
| · | 1 | 1 | 1 | 1 |

270b

P30 P31

Second-Type Write Command (WTb)

CONTROLLER FOR MANAGING ORDER INFORMATION OF DATA, OPERATION METHOD THEREOF, AND MEMORY SYSTEM INCLUDING THE SAME

CROSS-REFERENCE TO RELATED APPLICATION

This application claims priority under 35 U.S.C. § 119 to Korean Patent Application No. 10-2020-0125764 filed on Sep. 28, 2020, which is incorporated herein by reference in its entirety.

BACKGROUND

1. Field

Various embodiments relate to a controller capable of managing order information of data, and an operation method thereof.

2. Discussion of the Related Art

Recently, the paradigm for the computing environment has transitioned to ubiquitous computing in which computer systems can be used anytime, anywhere. Therefore, the use of portable electronic devices such as mobile phones, digital cameras and notebook computers has rapidly increased. Such portable electronic devices generally use a memory system using a memory device, that is, a data storage device. The data storage device is used as a main or secondary memory device of the portable electronic device.

Since a data storage device using a memory device has no mechanical driver, the data storage device has excellent stability and durability, high information access speed, and low power consumption. As an example of a memory system having such advantages, the data storage device includes a universal serial bus (USB) memory device, a memory card having various interfaces, a solid state drive (SSD) and the like.

SUMMARY

Various embodiments are directed to a controller capable of setting order information of data using a bitmap table according to a request from a host, and managing data based on the order information, and an operation method thereof.

In an embodiment, a memory system may include: a memory device comprising a plurality of pages; and a controller suitable for storing data, inputted in response to a write command received from a host, in corresponding pages among the plurality of pages, wherein the controller generates and manages a bitmap table indicating order information of the inputted data according to the type of the write command.

In an embodiment, a controller may include: an address map management component suitable for managing an address map table indicating relationships between logical addresses of write data and physical addresses of pages in which the write data are stored, among a plurality of pages; a bitmap management component suitable for setting bits indicating order information of the write data based on the type of a write command, and managing a bitmap table indicating the relationships between the set bits of the write data and the pages in which the write data are stored; and a background control component suitable for performing a background operation on the plurality of pages based on the bitmap table.

In an embodiment, an operation method of a controller may include: detecting a target page among a plurality of pages; checking the logic level of a bit corresponding to the detected target page in a bitmap table; and detecting, as the target page, a page adjacent to the detected target page, based on the check result.

In an embodiment, a memory system may include: a memory device including a plurality of pages; and a memory controller suitable for: receiving multiple pieces of write data associated with a write command from a host; storing the multiple pieces of the write data in corresponding pages among the plurality of pages; generating a bitmap table based on the type of the write command, the bitmap table including multiple bits respectively corresponding to the multiple pieces or write data, each bit indicating whether or not the corresponding piece of write data is to be processed after a previous piece of write data is processed; selecting a target page for a background operation among the corresponding pages, and one or more pages adjacent to the target page, using the bitmap table, bits of the bitmap tables of the target and adjacent pages having the same respective values; and performing the background operation on the target and adjacent pages.

In accordance with an embodiment, the controller and the data processing system can generate a bitmap table indicating order information of data stored in a memory device, and process data associated with each other at the same time, despite various operations of the memory device. Such an operation can reduce the overhead of the controller according to a request from the host, and quickly provide data stored in the memory device to the host.

DETAILED DESCRIPTION

Various embodiments are described in detail below with reference to the accompanying drawings. The following description focuses on features and aspects of the present invention; description of well-known material may be omitted so as not to unnecessarily obscure such features and aspects.

Figure 1:
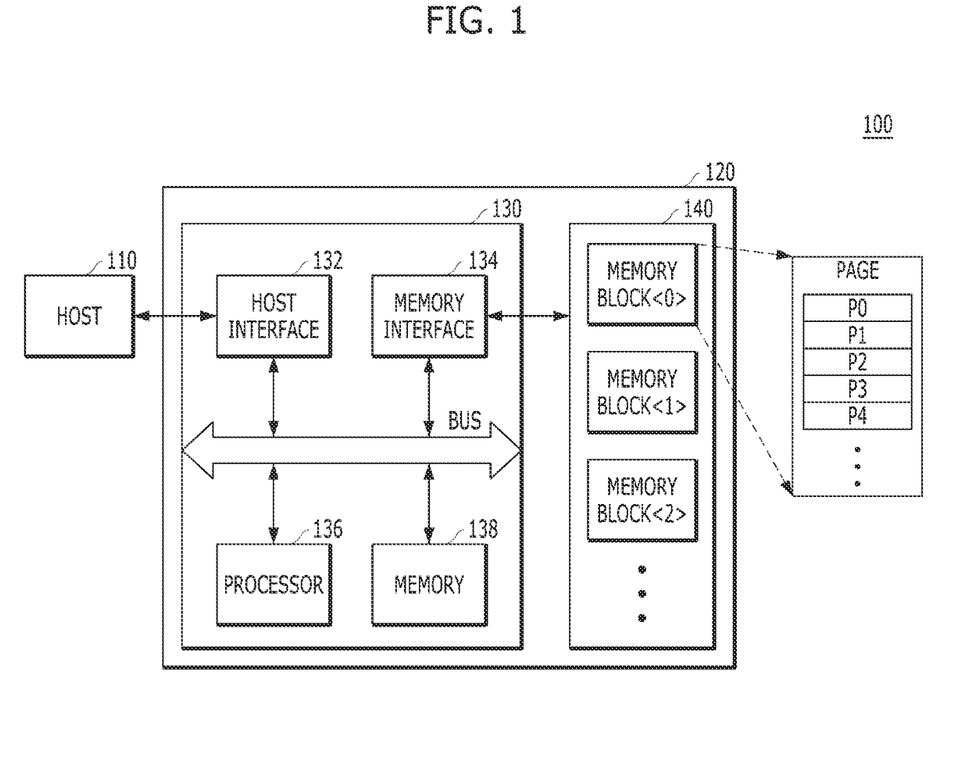
FIG. 1 is a block diagram illustrating a data processing system including a memory system in accordance with an embodiment.

FIG. 1 is a block diagram illustrating a data processing system 100 in accordance with an embodiment. Referring to FIG. 1, the data processing system 100 may include a host 110 and a memory system 120.

For example, the host 110 may be any of various electronic devices, including any of various portable electronic devices such as a mobile phone, MP3 player or laptop computer, as well as any of various larger electronic devices such as a desktop computer, game machine, TV or projector. Moreover, the host 110 encompasses all suitable wired and wireless electronic devices. The host 110 includes one or more operating systems (OSs), and the OS manages and controls overall function and operation of the host 110, and provides interactions between the host 110 and a user of the data processing system 100 or the memory system 120.

The OS may support a function and operation corresponding to the purpose of use of a user. For example, the OS may be divided into a general OS and a mobile OS depending on the mobility of the host 110. Among the OSs, the general OS may be divided into a personal OS and an enterprise OS depending on the use environments. For example, the personal OS may be a system specified to support a service providing function for general users, and include Windows, Chrome and the like. The enterprise OS may be a system specified to secure and support high performance, and include Windows Server, Linux, Unix and the like. Furthermore, the mobile OS among the OSs may be a system specified to support a system power saving function and a function of providing mobility to users, and include Android, iOS, Windows Mobile and the like. The host 110 may include a plurality of OSs, and execute an OS to perform an operation with the memory system 120 according to a user request. The host 110 may transmit a plurality of commands corresponding to the user request to the memory system 120. Thus, the memory system 120 may perform operations corresponding to the commands, i.e., operations corresponding to the user request.

The memory system 120 may operate in response to a request of the host 110. In particular, the memory system 120 may store data accessed by the host 110. In other words, the memory system 120 may be used as a main memory device or auxiliary memory device of the host 110. The memory system 120 may be implemented as any one of various types of storage devices, according to a host interface protocol coupled to the host 110.

For example, the memory system 120 may be implemented as a solid state drive (SSD) integrated into one semiconductor device. Furthermore, the memory system 120 may be implemented as any of various types of storage devices including a multi media card (MMC) such as an eMMC (embedded MMC), reduced size MMC (RS-MMC) or micro-MMC, a secure digital (SD) card such as a mini-SD or micro-SD card, a universal serial bus (USB) storage device, a universal flash storage (UFS) device, a compact flash (CF) card, a smart media card and/or a memory stick.

For another example, the memory system 120 may constitute a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game machine, a navigation system, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage constituting a data center, a device capable of transmitting/receiving information in a wireless environment, one of various electronic devices constituting a home network, one of various electronic devices constituting a computer network, one of various electronic devices constituting a telematics network, a radio frequency identification (RFID) device, or one of various components constituting a computing system.

Specifically, the memory system 120 may include a volatile memory device such as a dynamic random access memory (DRAM) or static RAM (SRAM) and/or a non-volatile memory device such as a read only memory (ROM), mask ROM (MROM), programmable ROM (PROM), erasable PROM (EPROM), electrically erasable PROM (EEPROM), ferromagnetic ROM (FRAM), phase change RAM (PRAM), magnetic RAM (MRAM), resistive RAM (RRAM) or flash memory.

Referring to FIG. 1, the memory system 120 may include a controller 130 and a memory device 140. The controller 130 may process data accessed by the host 110, and the memory device 140 may store the data processed by the controller 130.

The controller 130 may control the memory device 140 in response to a request from the host 110. For example, the controller 130 may provide the host 110 with data read from the memory device 140, and store data provided from the host 102 in the memory device 140. To this end, the controller 130 may control operations of the memory device 140, such as write, read, program, erase and background operations.

Specifically, the controller 130 may include a host interface 132, a memory interface 134, a processor 136 and a memory 138. All of the components 132, 134, 136 and 138 included in the controller 130 may share signals transferred inside the controller 130 through an internal bus.

The host interface 132 may interface the host 110 and the memory system 120 according to a protocol of the host 110. The host interface 132 may perform an operation of exchanging commands and data transferred between the host 110 and the memory system 120.

For example, the host interface 132 may communicate with the host 110 through one or more of various interface protocols such as Universal Serial Bus (USB), Multi-Media Card (MMC), Peripheral Component Interconnect-Express (PCI-e or PCIe), Serial-attached SCSI (SAS), Serial Advanced Technology Attachment (SATA), Parallel Advanced Technology Attachment (PATA), Small Computer System Interface (SCSI), Enhanced Small Disk Interface (ESDI), Integrated Drive Electronics (IDE) and/or MIPI (Mobile Industry Processor Interface (MIPI). The host interface 132, through which data are exchanged with the host 110, may be driven through firmware referred to as an HIL (Host Interface Layer).

The memory interface 134 may serve as a memory/storage interface for interfacing the controller 130 and the memory device 140, such that the controller 130 controls the memory device 140 in response to a request from the host 110. The memory interface 134 may serve as a NAND flash controller (NFC) when the memory device 140 is a flash memory, for example, a NAND flash memory. Under control of the processor 136, the memory interface 134 may generate a control signal of the memory device 140, and process data.

The memory interface 134 may support an interface operation of processing commands and data between the controller 130 and the memory device 140. In particular, the memory interface 134 may support data input/output between the controller 130 and the memory device 140. The memory interface 134, through which data are exchanged with the memory device 140, may be driven through firmware referred to as a flash interface layer (FIL).

The processor 136 may control all operations of the memory system 120. In particular, the processor 136 may control a program operation or read operation on the memory device 140, in response to a write request or read request from the host 110. The processor 136 may drive firmware referred to as a flash translation layer (FTL) in order to control overall operation of the memory system 120. The processor 136 may be implemented as a microprocessor or central processing unit (CPU).

For example, the controller 130 may perform a foreground operation corresponding to a command received from the host 110, through the processor 136. The controller 130 may perform a program operation corresponding to a write command, a read operation corresponding to a read command, an erase operation corresponding to an erase command, and a parameter set operation corresponding to a set parameter or set feature command.

Furthermore, the controller 130 may perform a background operation on the memory device 140, through the processor 136. The background operation on the memory device 140 may include a garbage collection operation, a wear levelling operation, a map flush operation, a bad block management operation and the like.

The garbage collection operation may include an operation of copying data, stored in a memory block among a plurality of memory blocks MEMORY BLOCK<0, 1, 2, . . . > of the memory device 140, into another memory block and processing the copied data. The wear levelling operation may include an operation of swapping and processing data stored in the memory blocks MEMORY BLOCK<0, 1, 2, . . . > of the memory device 140. The map flush operation may include an operation of storing map data stored in the controller 130 into the memory blocks MEMORY BLOCK<0, 1, 2, . . . > of the memory device 140. The bad block management operation may include an operation of checking and processing a bad block among the memory blocks MEMORY BLOCK<0, 1, 2, . . . > of the memory device 140.

The controller 130 may generate and manage log data in response to an operation of accessing the memory blocks MEMORY BLOCK<0, 1, 2, . . . > of the memory device 140, through the processor 136. The operation of accessing the memory blocks MEMORY BLOCK<0, 1, 2, . . . > of the memory device 140 may include performing a foreground operation or background operation on the memory blocks MEMORY BLOCK<0, 1, 2, . . . > of the memory device 140.

In accordance with an embodiment, the controller 130 may store data requested by the host 110 in corresponding pages among a plurality of pages P<0, 1, 2, 3, 4, . . . > included in the memory device 140, through the processor 136. The controller 130 may generate and manage a bitmap table indicating the order information of data according to commands received from the host 110.

Data processed by a computer system including the data processing system 100 may have temporal locality and spatial locality. That is, depending on random access to data, data adjacent to highly accessed data are also highly likely to be repeatedly accessed. The host 110 may request such data from the memory system 120 through a fixed order of write operations.

For example, a fixed order of write operations may be requested by the host 110, according to two types. First, the host 110 may request that write operations be executed in a fixed order with respect to previous write data as well as corresponding write data. Second, the host 110 may request that write operations be executed in a fixed order with respect to the corresponding write data. The host 110 may transmit first and second types of write commands to the memory system 120, and instruct the memory system 120 to perform two types of write operations, respectively. When transmitting write commands through a signal composed of a plurality of bits, the host 110 may change set bits of the plurality of bits, and thus transmit the first and second types of write commands.

In response to the first type of write command, the controller 130 may set bits, corresponding to the corresponding pages in the bitmap table, to the same logic level. In response to the second type of write command, the controller 130 may set a first bit and the other bits, corresponding to the corresponding pages in the bitmap table, to different logic levels.

As described above, the controller 130 may perform a background operation on the memory device 140. That is, the controller 130 may detect a target page among the plurality of pages P<0, 1, 2, 3, 4, . . . > in the memory device 140, and migrate data of the detected target page to another page among the plurality of pages P<0, 1, 2, 3, 4, . . . >. The data migration may include a copy operation, a swap operation and the like.

Figure 3A:
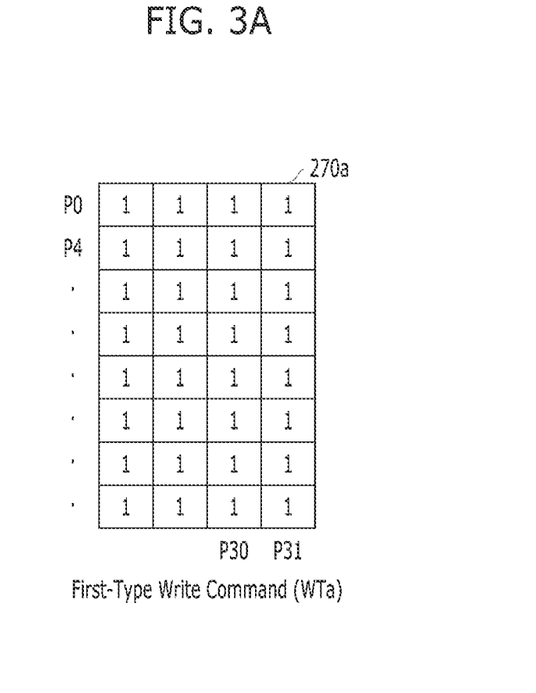
FIG. 3A and FIG. 3B are diagrams for describing an operation of a bitmap management component, such as that illustrated in FIG. 2.
Figure 3B:
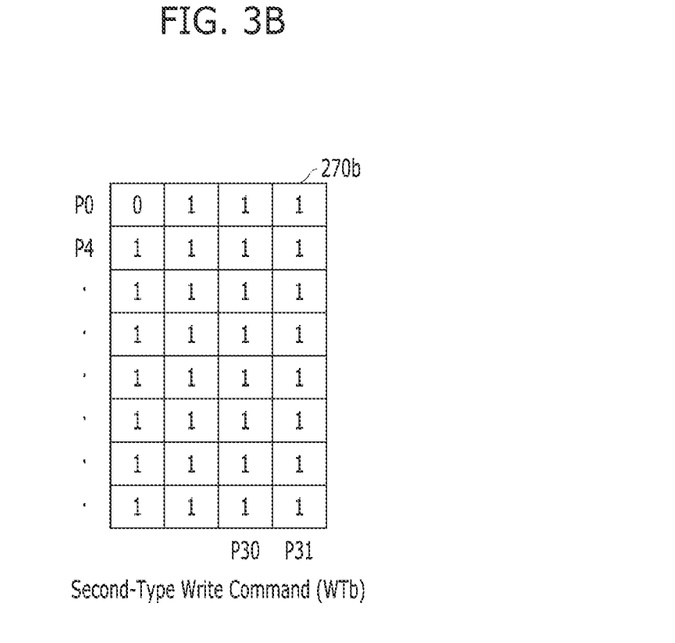

The controller 130 may check the logic level of a bit corresponding to the detected target page in the bitmap table. Further, the controller 130 may detect, as a target page, a page adjacent to the detected target page, based on the check result. The operation of the controller 130 is described in more detail with reference to FIGS. 3 and 4.

The memory 138 may serve as a working memory of the memory system 120 and the controller 130, and store data for driving the memory system 120 and the controller 130. When the controller 130 controls the memory device 140 in response to a request from the host 110, the memory 138 may store firmware driven by the processor 136 and data for driving the firmware, for example, meta data.

The memory 138 may serve as a buffer memory of the memory system 120 and the controller 130, and temporarily store write data received from the host 110 and to be transmitted to the memory device 140, and may temporarily store read data received from the memory device 140 and to be transmitted to the host 110. The memory 138 may include a program memory, a data memory, a write buffer/cache, a read buffer/cache, a data buffer/cache, a map buffer/cache and the like, in order to store such data.

The memory 138 may be implemented as a volatile memory. For example, the memory 138 may include any of a static random access memory (SRAM) or dynamic random access memory (DRAM). Although FIG. 1 illustrates that the memory 138 is included in the controller 130, the present invention is not limited thereto. The memory 138 may be provided outside the controller 130, and the controller 130 may input/output data to/from the memory 138 through a separate memory interface (not illustrated).

The memory device 140 may operate as a storage medium of the memory system 120. The memory device 140 may retain data stored therein even though power is not supplied. In particular, the memory device 140 may store data provided from the host 110 through a write operation, and provide data stored therein to the host 110 through a read operation.

The memory device 140 may be implemented as a flash memory, for example, a nonvolatile memory such as a NAND flash memory. The memory device 140 may be implemented as any of various memories such as a phase change random access memory (PCRAM), resistive random access memory (RRAM or ReRAM), ferroelectrics random access memory (FRAM) and/or spin transfer torque magnetic random access memory (STT-RAM or STT-MRAM).

The memory device 140 may include the plurality of memory blocks MEMORY BLOCK<0, 1, 2, . . . >, each of which may include a plurality of pages P<0, 1, 2, 3, 4, . . . >. Although not illustrated in the drawing, each of the pages P<0, 1, 2, 3, 4, . . . > may include a plurality of memory cells.

Each of the memory blocks MEMORY BLOCK<0, 1, 2, . . . > may be a single level cell (SLC) memory block or a multi-level cell (MLC) memory block, according to the number of bits which can be stored in, or expressed by, one memory cell included therein. An SLC memory block includes a plurality of pages which are implemented by memory cells each capable of storing one-bit data therein, and has high data computation performance and high durability. An MLC memory block includes a plurality of pages which are implemented by memory cells each capable of storing multi-bit data therein (for example, two or more bits). Having a larger data storage space than an SLC memory block, an MLC memory block may have a higher degree of integration than an SLC memory block.

As memory cell storage capacity has increased, the term MLC is sometimes used to more specifically refer to a memory cell capable of storing two bits of data, and thus an MLC memory block refers to a memory block with such MLCs. In that case, a triple level cell (TLC) memory block includes a plurality of pages which are implemented by memory cells each capable of storing three-bit data therein, and a quadruple level cell (QLC) memory block includes a plurality of pages which are implemented by memory cells each capable of storing four-bit data therein. Higher storage capacity blocks are also available for use, where each such memory block includes a plurality of pages which are implemented by memory cells each capable of storing five or more-bit data therein.

Figure 2:
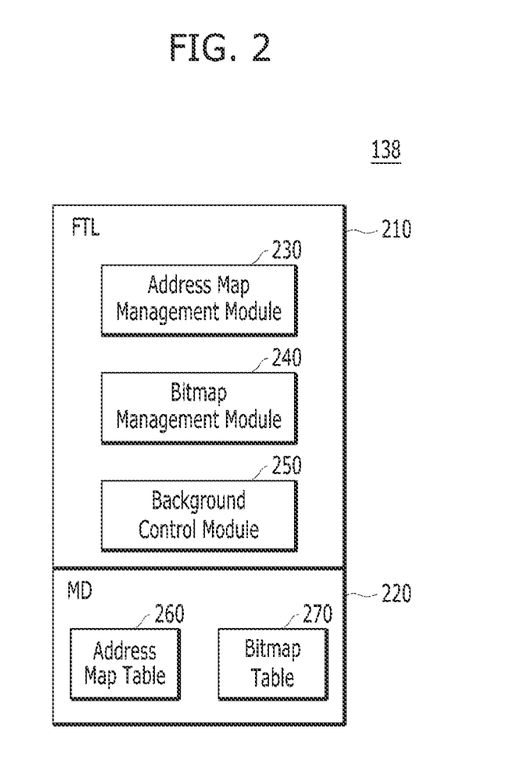
FIG. 2 is a diagram illustrating a memory, such as that illustrated in FIG. 1.

FIG. 2 is a diagram illustrating the memory 138 of FIG. 1.

Referring to FIG. 2, the memory 138 may include an area 210 in which the flash translation layer FTL driven by the processor 136 is stored and an area 220 in which meta data MD for driving various modules included in the flash translation layer FTL are stored. By way of example, FIG. 2 illustrates that the memory 138 includes two areas. However, the memory 138 may further include other areas for storing various data. For example, the memory 138 may further include a command queue area in which commands generated according to requests received from the host 110 are queued, a write data buffer area in which write data are stored, and a read data buffer area in which read data are stored.

In some embodiments, the flash translation layer FTL may be stored in a system area (not illustrated) of the memory device 140. While the memory system 120 is booted up, the flash translation layer FTL may be read from the system area of the memory device 140, and stored in the memory 138. The flash translation layer FTL may include various function modules. In accordance with an embodiment, the flash translation layer FTL may include an address map management module (or address map management component) 230, a bitmap management module (or bitmap management component) 240 and a background control module (or background control component) 250.

The address map management component 230 may map the logical addresses of write data, requested by the host 110, to actual addresses of the memory device 140, i.e. physical addresses, and manage the mapped addresses. The address map management component 230 may generate and manage an address map table 260 indicating the relationships between the logical addresses of the write data and the physical addresses of pages in which the write data are stored, among the plurality of pages P<0, 1, 2, 3, 4, . . . >. The address map table 260 generated by the address map management component 230 may be stored in the meta data area 220 of the memory 138.

The bitmap management component 240 may set bits indicating the order of write data, according to the types of write commands requested by the host 110. The bits or other indicia used to indicate the order of data may be referred to an order information, The bitmap management component 240 may generate and manage a bitmap table 270 such that certain (set) bits indicate relationships between the write data and the pages P<0, 1, 2, 3, 4, . . . > in which the write data are stored. The bitmap table 270 generated by the bitmap management component 240 may be stored in the meta data area 220 of the memory 138.

The background control component 250 may perform a background operation of the memory device 140, for example, a garbage collection operation, a wear levelling operation, a read reclaim operation and the like. That is, the background control component 250 may detect a target page among the pages P<0, 1, 2, 3, 4, . . . > of the memory device 140, and migrate data of the detected target page to another page among the pages P<0, 1, 2, 3, 4, . . . >.

The background control component 250 may perform a background operation based on the bitmap table 270. The background control component 250 may check the logic level of a bit corresponding to the detected target page in the bitmap table 270. Further, the background control component 250 may detect, as a target page, a page adjacent to the detected target page, based on the check result.

FIG. 3A and FIG. 3B are a diagram for describing an operation of the bitmap management component 240 illustrated in FIG. 2. By way of example, FIG. 3A and FIG. 3B illustrate bitmap tables 270a and 270b generated by the bitmap management component 240.

Referring to FIG. 3A and FIG. 3B, the bitmap tables 270a and 270b may correspond to an open memory block allocated by the processor 136, in order to store write data requested by the host 110. For example, the bitmap tables 270a and 270b may correspond to a unit memory block or a super memory block obtained by grouping two or more of the memory blocks MEMORY BLOCK<0, 1, 2, . . . > in the memory device 140.

Each of the bitmap tables 270a and 270b may include a plurality of bits, each of which may respectively correspond to one pages in an open memory block. By way of example, FIG. 3A and FIG. 3B illustrate the case in which data having a size corresponding to 32 logic addresses are stored in one open memory block, according to a request from the host 110. However, the present invention is not limited thereto.

Referring to FIG. 3A, when a first type of write command WTa is received from the host 110, the bitmap management component 240 may set bits of the bitmap table 270a, corresponding to pages P<0, . . . , 31> in which write data are stored, to a first logic level, e.g., 1.

Referring to FIG. 3B, when a second type of write command WTb is received from the host 110, the bitmap management component 240 may set the bit corresponding to the first page P<0> to a second logic level different from the first logic level, while setting the bits of the bitmap table 270b, corresponding to the pages P<0, . . . , 31> in which write data are stored, to the first logic level. For example, in response to the second type of write command WTb, the bitmap management component 240 may set the bit corresponding to the first page P<0> to a logic low level '0' while setting the bits of the bitmap table 270b, corresponding to the pages P<0, . . . , 31>, to the logic high level '1'.

That is, when a bit of each of the bitmap tables 270a and 270b is set to the first logic level '1', it may indicate that data stored in the corresponding page is processed in a fixed order, i.e., subsequent to data stored in the previous page. When a bit of each of the bitmap tables 270a and 270b is set to the second logic level '0', it may indicate that data stored in the corresponding page is processed regardless of when data stored in the previous page is processed.

Figure 4:
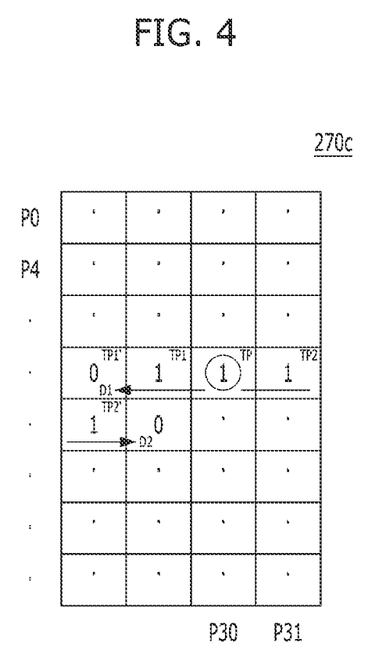
FIG. 4 is a diagram for describing an operation of a background control component, such as that illustrated in FIG. 2.

FIG. 4 is a diagram for describing an operation of the background control component 250 illustrated in FIG. 2. By way of example, FIG. 4 illustrates the case in which the background control component 250 performs a garbage collection operation.

When the number of free memory blocks (i.e., available memory blocks including only invalid data) within the memory device 140 becomes less than or equal to a set threshold value, the background control component 250 may perform a garbage collection operation on the memory device 140. The background control component 250 may select a victim memory block in the memory device 140, and change the victim memory block to a free memory block by migrating valid data stored in the victim memory block to a target memory block.

The background control component 250 may manage valid data information to select a victim memory block, and detect a page, as a target page, in which valid data are stored, among the pages included in the victim memory block, The background control component 250 may check the logic level of a bit corresponding to the detected target page in the bitmap table, and additionally detect, as a target page, a page adjacent to the detected target page, based on the check result.

Referring to FIG. 4, the background control component 250 may check the logic level of a bit corresponding to a detected target page TP in a bitmap table 270c corresponding to the victim memory block. When the bit corresponding to the detected target page TP has the first logic level '1', the background control component 250 may detect, as a first target page TP1, a page adjacent to the detected target page TP in a first direction D1.

The background control component 250 may check the logic level of the bit corresponding to the first target page TP1 in the bitmap table 270c, Until the bit corresponding to the first target page TP1 is or changes to the second logic level '0', the background control component 250 may detect another target page, i.e., a first target page TP1' adjacent to the first target page TP1 in the first direction D1.

As described above, when the bit corresponding to the detected target page TP has the first logic level '1', it may indicate that data stored in the detected target page TP and the previous data stored in the previous page, i.e., the page adjacent to the detected target page TP in the first direction D1, are in a fixed order. Therefore, the background control component 250 may immediately detect, as the first target page TP1, i.e., the page adjacent to the detected target page TP in the first direction D1, and process the data of the target pages TP and TP1 together.

Regardless of the logic level of the bit corresponding to the detected target page TP, the background control component 250 may check the logic level of a bit, corresponding to a page adjacent to the detected target page TP in a second direction D2, in the bitmap table 270c. When the bit corresponding to the page adjacent in the second direction D2 has the first logic level '1', the background control component 250 may detect the page adjacent in the second direction D2 as a second target page TP2. Until the bit corresponding to the page adjacent in the second direction D2 is or changes to the second logic level '0', the background control component 250 may detect another target page, i.e., a second target page TP2' adjacent to the detected target page TP in the second direction D2.

The first and second directions D1 and D2 may be changed according to the order in which data are stored in the pages P<0, 4, . . . , 30, 31>. In the illustrated example of FIG. 4, data are stored in the pages P<0, 4, . . . , 30, 31> in order from the left to the right and from the top to the bottom in the bitmap table 270. That is, a page adjacent to the detected target page TP in the first direction D1 may include a page in which data are stored before data are stored in the detected target page TP. Furthermore, a page adjacent to the detected target page TP in the second direction D2 may include a page in which data are stored after data are stored in the detected target page TP.

By way of example, FIG. 4 illustrates that the background control component 250 performs a garbage collection operation, but the present invention is not limited thereto. As described above, the background control component 250 may perform a wear levelling operation, a read reclaim operation and the like. That is, an operation performed by the background control component 250 may include all operations which are performed to detect a target area within the memory device 140 and migrate data of the detected target area.

Figure 5:
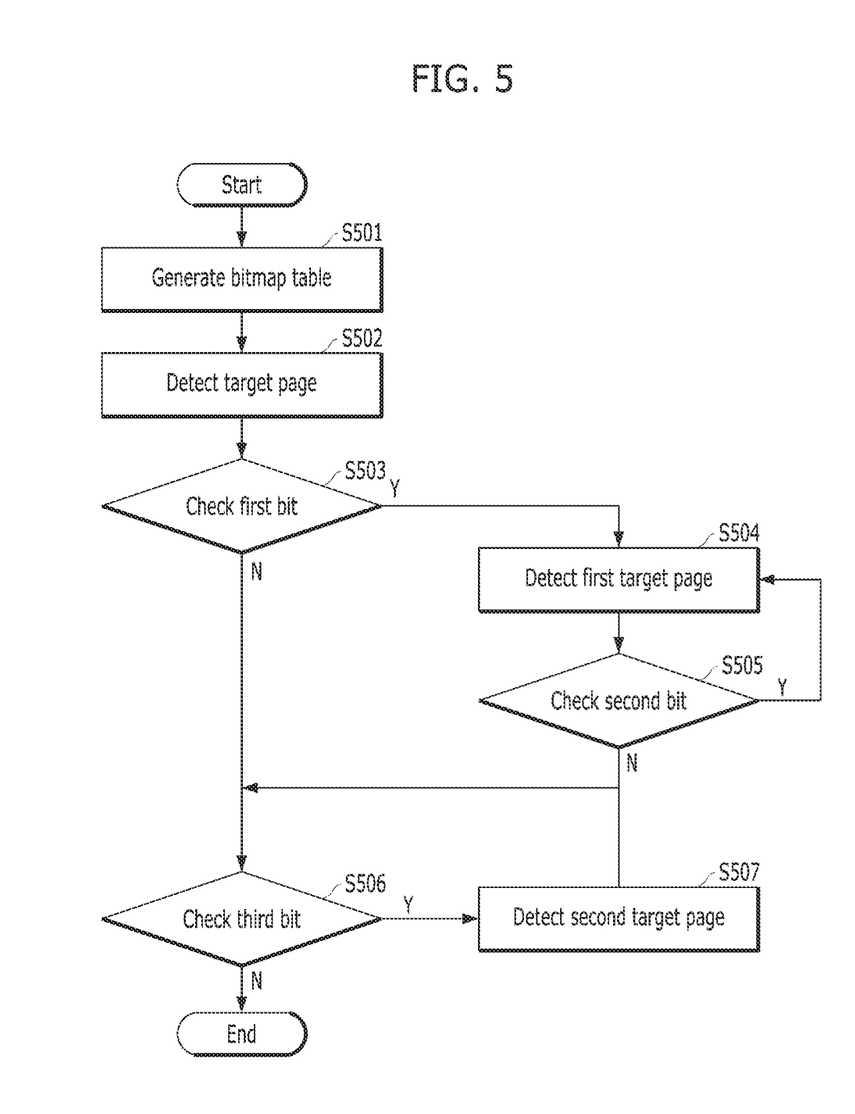
FIG. 5 is a flowchart illustrating an operation of a controller in accordance with an embodiment.

FIG. 5 is a flowchart illustrating an operation of the controller 130 in accordance with an embodiment. Referring to FIGS. 1 to 5, the operation of the controller 130 is described below.

In operation S501, the controller 130 may store data requested by the host 110 in corresponding pages among a plurality of pages P<0, 1, 2, 3, 4, . . . >, and simultaneously generate and manage the bitmap table 270 indicating the order of the corresponding pages according to commands received from the host 110. Specifically, in response to a first type of write command WTa, the bitmap management component 240 of the controller 130 may set bits of the bitmap table 270a, corresponding to pages P<0, . . . , 31> in which write data are stored, to the first logic level. Furthermore, in response to a second type of write command WTb, the bitmap management component 240 may set the bit corresponding to the first page P<0> to the second logic level different from the first logic level, while setting bits of the bitmap table 270b, corresponding to the pages P<0, . . . , 31> in which the write data are stored, to the first logic level.

In operation S502, the controller 130 may detect a target page among the plurality of pages P<0, 1, 2, 3, 4, . . . >. For example, the background control component 250 of the controller 130 may manage valid data information to select a victim memory block, and detect, as a target page, a page in which valid data are stored, among the pages included in the victim memory block.

In operation S503, the background control component 250 may check the logic level of a bit corresponding to the detected target page TP in the bitmap table 270c. The background control component 250 may additionally detect, as a target page, a page adjacent to the detected target page TP, based on the check result.

Specifically, when the bit corresponding to the detected target page TP is determined to be the first logic level ("Y" in operation S503), the background control component 250 may perform operations S504 and S505. That is, the background control component 250 may detect, as a first target page TP1, a page adjacent to the detected target page TP in the first direction D1, and check the logic level of a bit corresponding to the first target page TP1 in the bitmap table 270c.

Until the bit corresponding to the first target page TP1 is or changes to the second logic level ("N" in operation S505), the background control component 250 may repeatedly perform operations S504 and S505. The background control component 250 may continue to detect, as the first target pages TP1 and TP1', pages adjacent to the first target page TP1 in the first direction D1.

In operation S506, the background control component 250 may check the logic level of a bit, corresponding to a page adjacent to the detected target page TP in the second direction D2, in the bitmap table 270c. Specifically, when the bit corresponding to the page adjacent in the second direction D2 is determined to be the first logic level ("Y" in operation S506), the background control component 250 may perform operation S507. That is, the background control component 250 may detect the page adjacent in the second direction D2 as a second target page TP2.

Furthermore, until the bit corresponding to the page adjacent in the second direction D2 is or changes to the second logic level ("N" in operation S506), the background control component 250 may repeatedly perform operations S507 and S506. The background control component 250 may continue to detect, as the second target pages TP2 and TP2', pages adjacent to the detected target page TP in the second direction D2.

In accordance with the above-described embodiments, the memory system may generate a bitmap table indicating the order of data stored in the memory device, and process associated data together despite various internal operations of the memory device. Through this operation, the memory system may reduce the overhead of the controller according to a host request, and quickly provide data stored in the memory device.

Although various embodiments have been illustrated and described, it will be apparent to those skilled in the art that various changes and modifications may be made without departing from the spirit and scope of the invention as defined in the following claims.

What is claimed is:

1. A memory system comprising:
a memory device comprising a plurality of pages; and
a controller suitable for storing data, inputted in response to a write command received from a host, in corresponding pages among the plurality of pages,
wherein the controller generates and manages a bitmap table indicating order information of the inputted data according to the type of the write command,
wherein the order information for a first type of the write command indicates that the inputted data are in a fixed order with respect to previous write data and corresponding write data, and the order information for a second type of the write command indicates that the inputted data are in a fixed order with respect to the corresponding write data,
wherein the controller, during a background operation, detects a target page among the plurality of pages and checks the logic level of a bit corresponding to the detected target page in the bitmap table,
wherein the controller, during the background operation, detects, as other target pages, pages adjacent to the detected target page in a first direction for the first type of the write command and pages adjacent to the detected target page in a second direction for the second type of the write command, based on the check result until the bit corresponding to a first target page is or changes to a second logic level, and
wherein the controller, during the background operation, migrates data of the detected target page and the detected other target pages to other pages among the plurality of pages.

2. The memory system of claim 1, wherein the controller sets bits, corresponding to the corresponding pages in the bitmap table, to the same logic level in response to the first type of the write command indicating that the inputted data are in the fixed order with respect to the previous data and the corresponding write data.

3. The memory system of claim 2, wherein the controller sets a first bit and the other bits of the bits, corresponding to the corresponding pages in the bitmap table, to different logic levels in response to the second type of the write command indicating that the inputted data are in the fixed order with respect to the corresponding write data.

4. The memory system of claim 3, wherein the logic levels of set bits for the first type of write command is different than the logic levels of set bits for the second type of write command.

5. A controller comprising:
an address map management component suitable for managing an address map table indicating relationships between logical addresses of write data and physical addresses of pages in which the write data are stored, among a plurality of pages;
a bitmap management component suitable for setting bits indicating order information of the write data based on a type of a write command, and managing a bitmap table indicating the relationships between the set bits of the write data and the pages in which the write data are stored; and
a background control component suitable for performing a background operation on the plurality of pages based on the bitmap table,
wherein the bitmap management component sets bits of the bitmap table, corresponding to the pages in which the write data are stored, to a first logic level in response to a first type of the write command indicating that the write data are in a fixed order with respect to a previous data and corresponding write data, and for a second type of the write command indicates that the inputted data are in a fixed order with respect to the corresponding write data,
wherein the background control component detects a target page among the plurality of pages, and checks the logic level of a bit corresponding to the detected target page in the bitmap table, and detects, as other target pages, pages adjacent to the detected target page in a first direction for the first type of the write command and pages adjacent to the detected target page in a second direction for the second type of the write command, based on the check result until the bit corresponding to a first target page is or changes to a second logic level, and
wherein the background control component migrates data of the detected target page and the detected other target pages to other pages among the plurality of pages.

6. The controller of claim 5, wherein, while setting the bits of the bitmap table, corresponding to the pages in which the write data are stored, to the first logic level, the bitmap management component sets a first bit of the bits to a second logic level different from the first logic level, in response to a second type of the write command indicating that the write data are in a fixed order without regard to the previous data.

7. The controller of claim 5, wherein, when the bit corresponding to the detected target page has a first logic level, the background control component detects, as a first target page, a page adjacent to the detected target page in a first direction, for the first type write command, and checks the logic level of a bit corresponding to the first target page in the bitmap table.

8. The controller of claim 7, wherein, until the bit corresponding to the first target page is a second logic level, the background control component continues to detect, as the first target page, pages adjacent to the first target page in the first direction.

9. The controller of claim 5, wherein, regardless of the logic level of the bit corresponding to the detected target page, the background control component checks the logic level of a bit, corresponding to a page adjacent to the detected target page in a second direction for the second type write command, in the bitmap table.

10. The controller of claim 9, wherein, when the bit corresponding to the page adjacent in the second direction has the first logic level, the background control component detects, as a second target page, the page adjacent in the second direction.

11. The controller of claim 10, wherein, until the bit corresponding to the page adjacent in the second direction is the second logic level, the background control component continues to detect, as the second target page, pages adjacent to the detected target page in the second direction.

12. An operation method of a controller, comprising:
   detecting a target page among a plurality of pages;
   checking a logic level of a bit corresponding to the detected target page in a bitmap table; and
   detecting, as the target page, a page adjacent to the detected target page, based on the check result,
   wherein the bitmap table indicates order information of inputted data according to a type of a write command,
   wherein the order information for a first type of the write command indicates that the inputted data are in a fixed order with respect to previous write data and corresponding write data, and the order information for a second type of the write command indicates that the inputted data are in a fixed order with respect to the corresponding write data, and
   wherein the detecting of the page adjacent to the detected target page as the target page comprises:
   where the bit corresponding to the detected target page is a first logic level,
   detecting, as a first target page, a page adjacent to the detected target page in a first direction;
   checking the logic level of a bit corresponding to the first target page in the bitmap table;
   continuing to detect, as the first target page, pages adjacent to the first target page in the first direction, until the bit corresponding to the first target page is a second logic level; and
   migrating data of the detected target page and the detected first target pages to other pages among the plurality of pages.

13. The operation method of claim 12, wherein the detecting of the page adjacent to the detected target page as the target page comprises:
   checking the logic level of a bit, corresponding to a page adjacent to the detected target page in a second direction, in the bitmap table;
   detecting, for a second type write command, the page adjacent in the second direction as a second target page, when the bit corresponding to the page adjacent in the second direction is the first logic level; and
   continuing to detect, as the second target page, pages adjacent to the detected target page in the second direction, until the bit corresponding to the page adjacent in the second direction is the second logic level.

14. A memory system comprising:
   a memory device including a plurality of pages; and
   a memory controller suitable for:
   receiving multiple pieces of write data associated with a write command from a host;
   storing the multiple pieces of the write data in corresponding pages among the plurality of pages;
   generating a bitmap table based on the type of the write command, the bitmap table including multiple bits respectively corresponding to the multiple pieces or write data, each bit indicating whether or not the corresponding piece of write data is to be processed after a previous piece of write data is processed;
   selecting a target page for a background operation among the corresponding pages, and one or more pages adjacent to the target page, using the bitmap table, bits of the bitmap tables of the target and adjacent pages having the same respective values; and
   performing the background operation on the target and adjacent pages,
   wherein the multiple bits of the bitmap table are set to a first logic level in response to a first type of the write command indicating that the corresponding piece of write data are in a fixed order with respect to a previous piece of write data,
   wherein the memory controller detects the target page among the plurality of pages, checks the logic level of a bit corresponding to the detected target page in the bitmap table, and detects, as other target pages, pages adjacent to the detected target page, based on the check result until the bit corresponding to a first target page is or changes to a second logic level, and
   wherein the memory controller migrates data of the detected target page and the detected other target pages to other pages among the plurality of pages.

* * * * *